(12) United States Patent
Pain

(10) Patent No.: US 7,767,104 B2
(45) Date of Patent: Aug. 3, 2010

(54) METHOD FOR REPAIRING ERRORS OF PATTERNS EMBODIED IN THIN LAYERS

(75) Inventor: Laurent Pain, Saint Nicolas de Macherin (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/582,791

(22) PCT Filed: Dec. 15, 2004

(86) PCT No.: PCT/FR2004/050698

§ 371 (c)(1),
(2), (4) Date: Jun. 14, 2006

(87) PCT Pub. No.: WO2005/059651

PCT Pub. Date: Jun. 30, 2005

(65) Prior Publication Data

US 2007/0190241 A1    Aug. 16, 2007

(30) Foreign Application Priority Data

Dec. 16, 2003   (FR) .................................. 03 51067

(51) Int. Cl.
*C03C 25/68* (2006.01)
(52) U.S. Cl. .............................. 216/41; 216/49; 216/59; 216/62
(58) Field of Classification Search .................... 216/41, 216/49, 59, 60
See application file for complete search history.

(56) References Cited

U.S. PATENT DOCUMENTS

| | | | |
|---|---|---|---|
| 4,751,169 A | 6/1988 | Behringer et al. | |
| 5,945,238 A | 8/1999 | Huggins et al. | |
| 5,953,577 A | 9/1999 | Huggins et al. | |
| 5,985,518 A | 11/1999 | Huggins et al. | |
| 6,596,465 B1 | 7/2003 | Mangat et al. | |
| 6,777,137 B2 * | 8/2004 | Fisch et al. | 430/5 |
| 2002/0122995 A1 | 9/2002 | Mancini et al. | |
| 2003/0027053 A1 | 2/2003 | Yan | |
| 2003/0039923 A1 * | 2/2003 | Mangat et al. | 430/312 |
| 2004/0081896 A1 * | 4/2004 | Pierrat | 430/5 |
| 2004/0151991 A1 * | 8/2004 | Stewart et al. | 430/5 |
| 2005/0109278 A1 * | 5/2005 | Liang et al. | 118/723 FE |

FOREIGN PATENT DOCUMENTS

| | | |
|---|---|---|
| EP | 0 200 333 | 12/1986 |
| JP | 60 142518 | 12/1985 |

OTHER PUBLICATIONS

Lipp, S.et al.;"A Comparison of Focused Ion Beam and Electron Beam Induced Deposition Processes", Microelectron. Reltab., vol. 36, No. 11/12, pp. 1779-1782, 1996.
Ward, B.W.et al.,"Repair of Photomasks with Focussed Ion Beams", SPIE, vol. 537, pp. 110-116, 1985.

* cited by examiner

*Primary Examiner*—Binh X Tran
(74) *Attorney, Agent, or Firm*—Oblon, Spivak, McClelland, Maier & Neustadt, L.L.P.

(57) ABSTRACT

A fabrication method in thin layers, for example of integrated electronic circuits or MEMS. A correction method allows design errors made for example by photolithography in a thin layer to be repaired, and without necessarily having to utilize a new mask or without having to correct an erroneous mask. A lithography device allows certain of operations of such a method to be employed.

14 Claims, 7 Drawing Sheets

METHOD FOR REPAIRING ERRORS OF PATTERNS EMBODIED IN THIN LAYERS

TECHNICAL FIELD

The invention relates to the field of fabrication methods in thin layers, for example of integrated electronic circuits or MEMS (MEMS for electromechanical microsystems) and more particularly to that of making patterns on thin layers. The invention can be applied for example to making masks for lithography, such as for example masks for extreme ultraviolet photolithography. It proposes a method for repairing an erroneous design made in an engraved thin layer.

PRIOR ART

The fabrication of an integrated circuit in thin layers generally implies the formation of patterns in these thin layers.

Making one or more patterns in a thin layer most often uses a photolithography method during which a mask is generally used, comprising a design reproducing the patterns to be formed in the thin layer, generally on a larger scale.

Any error in the design of the mask, for example if one or more patterns of the mask are in excess or missing, can result directly in the non-functioning of the integrated circuit. This error or these design errors can originate from the designer of the design, or else from defects made on the mask during fabrication.

In the event of an error in conception of the design of the mask, it can prove to be necessary both to produce a new design, and then to make a new mask. In the case of fabrication defects in the mask, producing a new mask can prove to be necessary. In both cases, these errors can considerably increase the cost and time taken to fabricate the integrated circuit.

There are currently techniques for repairing design errors directly on the mask, such as those described in documents [1], [2], [3], cited at the end of the present description.

Losses in terms of money and time caused by design errors, made on one or more batches of integrated circuits during fabrication, do however remain significant, even when repairs are made directly to the mask.

In fact, techniques consisting of carrying out repairs on the mask generally do not enable repair of erroneous lots. On the other hand, while the mask is being repaired, other batches being fabricated and requiring said mask to be used can be blocked in their fabrication cycle.

SUMMARY OF THE INVENTION

The present invention relates to a method for correcting erroneous designs in a thin layer made, for example by photolithography, by means of a mask comprising a fabrication defect or/and a design defect.

The thin layer can be for example a layer of a microelectronic device during fabrication, for example a MEMS during fabrication (MEMS for electromechanical Microsystems) or an integrated circuit during fabrication.

The invention proposes a simple solution, which is to allow reduction of losses in time and costs, caused by such design errors made on thin layers of microelectronic devices.

Contrary to earlier techniques, the invention further reutilises integrated circuits during fabrication comprising design errors.

The invention first relates to a method for correction of a design formed in a first thin layer, comprising at least one etched or partially etched first sub-layer comprising said erroneous design, for example a sacrificial sub-layer or hard mask, and at least one second sub-layer located between the substrate and the first sub-layer, comprising the steps of:

a) depositing a second thin layer on said first thin layer or on the whole of the first thin layer, b) engraving, or lithography, in said second thin layer, as a function of the desired correction or corrections, c) etching or at least partial etching of the second sub-layer through the first sub-layer.

Design is understood to mean a set of patterns, for example in the form of one or more holes or/and one or more trenches.

In the second thin layer, lithography, a beam, or several beams, are used to form one or more corrective elements allowing correction of the erroneous design.

Next, etching of the second sub-layer is done through the first sub-layer.

A design error in the first thin layer can be due to one or more patterns lacking on the design.

In this case, the invention adds one or more missing patterns. This addition comprises the reproduction by step b) of the missing patterns in the second thin layer.

According to one possibility, at step b) several corrective elements or all the corrective elements can be completed at the same time.

The patterns added to the second thin layer can then be transferred to the first sub-layer by etching.

The first sub-layer can be etched after step b) and prior to step c), and the second thin layer can be removed after this additional etching step.

Therefore, once the addition of patterns has been made in the first sub-layer, the latter can reproduce the patterns in the second sub-layer, and the first sub-layer can then be removed.

A design error in the first thin layer may be due to one or more excess patterns on the design. In this case, the method according to the invention eliminates one or more excess patterns, step b) helping to form correction blocks filling these excess patterns.

According to one possibility, at step b) several correction blocks or all the correction blocks can be made at the same time.

A design error in a thin layer may be due to one or more missing patterns on the design and to one or more other excess patterns on the design. The invention likewise allows one or more missing patterns to be added, then allows one or more excess patterns to be eliminated.

The method according to the invention may thus comprise, after step b) and prior to step c):

removing of the second thin layer, deposit of a third thin layer on the first sub-layer, a second step of etching or lithography in the third thin layer leaving blocks filling the excess patterns, or, alternatively, etching or lithography, for example via direct writing, again in the second thin layer, and leaving blocks filling the excess patterns.

In one or the other case, after step c), either the third thin layer or the first sub-layer could be removed.

The two sub-layers constituting the first thin layer can be made based on two different materials, each of these two materials able to be conductive, semiconductive or insulating.

The invention likewise relates to a method for correction of an erroneous design made in a first at least partially etched thin layer, comprising the steps of:

a) depositing a second thin layer on said first thin layer, b) direct engraving, or lithography via direct writing, in said second thin layer, as a function of the desired correction, c) etching of the first layer through the second layer.

The step b) can comprise reproducing the missing patterns in the second thin layer, the second thin layer able to be removed after step c).

The second and/or the third thin layer can be for example a dielectric layer or an optionally positive or negative photosensitive resin layer, deposited on the first thin layer.

The steps of engraving can be completed due to one or more optical beams or to one or more particle beams. The beam can be X-rays, or laser beam, or a proton beam, or an ion beam, or an electron beam.

According to a variant implementation, the engraving steps and especially step b) can be carried out by means of several simultaneous light beams or particle beams.

Such a beam or such beams can be controlled by means of a digital device or digital processing device comprising correction data, prepared as a function of the corrections to be made.

This preparation can be done by comparison between design data or an erroneous design file, and design data or an exact design file.

The invention can correct these designs, without necessarily having to make use of a new mask or having need to correct the defective mask.

Therefore, the invention likewise relates to a correction method of design formed in a first thin layer, comprising at least one first sub-layer, etched or partially etched, comprising said erroneous design, for example a sacrificial sub-layer or hard mask layer, and at least one second sub-layer located between the substrate and the first sub-layer, comprising the steps of:

a) depositing a second thin layer on said first thin layer, b) direct engraving, or lithography by direct writing, in said second thin layer, as a function of the desired correction or corrections, c) etching or at least partial etching of the second sub-layer through the first sub-layer.

The invention likewise relates to a lithography device suitable for carrying out step b) of the method according to the invention. This device can comprise:

lithography apparatus or first means suitable for producing at least one lithography beam, second means for processing data relative to the erroneous design and to a desired corrected design, and for producing correction data following said processing, third means for controlling the lithography apparatus, from the correction data.

The invention likewise makes use of a computer program comprising program code instructions which can be entered into this computer for processing data relative to an erroneous design made in a thin layer and data relative to a desired corrected design, and, following such processing, for producing correction data utilisable by lithography apparatus or by means suitable for producing at least one light beam or particles for lithography.

The invention likewise employs a computer program product comprising code instructions of such a program entered on a medium utilisable in a computer, as well as a digital data medium utilisable by a computer, comprising code instructions of such a program.

BRIEF DESCRIPTION OF THE DRAWINGS

The present invention will be better understood from the description of exemplary embodiments given, purely by way of indication and non-limiting, with reference to the attached drawings, in which.

Identical, similar or equivalent parts of the different figures bear the same reference numerals in the interests of making it easier to pass from one figure to the other.

The different parts shown in the figures are not necessarily so according to a uniform scale to make the figures more legible.

DETAILED EXPLANATION OF PARTICULAR EMBODIMENTS

Figure 1A:
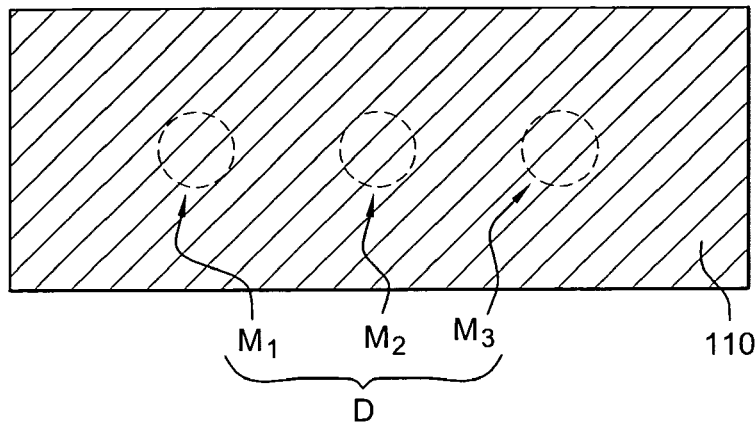
FIGS. 1A to 1B illustrate a layer of material in which patterns are to be made.

FIG. 1A illustrates a thin layer in a plan view in which patterns designated as $M_1, M_2, M_3$ are to be made in the form of hollow patterns (whereof the contours are shown in dashed lines in this figure), for example interconnection holes, or trenches likely to be filled later on by a semiconductive, or conductive or dielectric material. This thin layer will be called technological layer and designated by 110. It rests on a substrate, for example a silicon substrate (not shown in FIG. 1A). All of patterns $M_1, M_2, M_3$, will form a design D.

The technological layer 110 can be organic or mineral in nature, it can be conductive or semiconductive or insulating and can have a thickness for example between 1 nanometer and 10 micrometers.

This thin layer 110 can be a layer of a microelectronic device, for example an integrated circuit, during fabrication.

The technological layer 110 illustrated in FIG. 1A, is for example a layer based on TeOS of 600 nanometers thick.

Figure 1B:
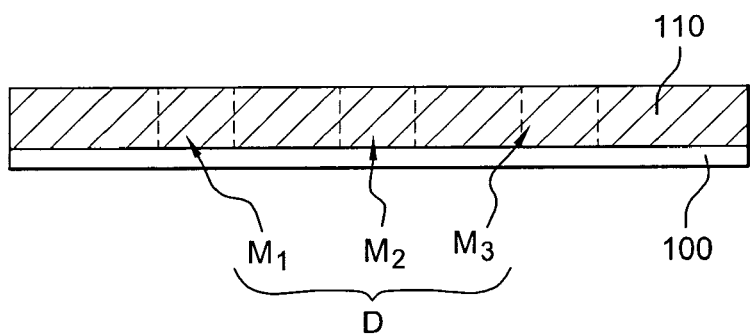

FIG. 1B illustrates a bottom view of this same technological layer 110 resting on the substrate 100. The patterns $M_1$, $M_2$, $M_3$, to be made in the form of hollow patterns in the technological layer 110 are likewise delimited by contours in dashed lines.

To make the patterns $M_1, M_2, M_3$, in the technological layer 110, a first method consists for example of initially forming these patterns $M_1, M_2, M_3$, by photolithography in a layer referred to as a sacrificial layer, deposited previously on the technological layer. Next, it is a matter of transferring the patterns $M_1, M_2, M_3$, to the technological layer 110, for example by etching the latter through the sacrificial layer.

Figure 2:
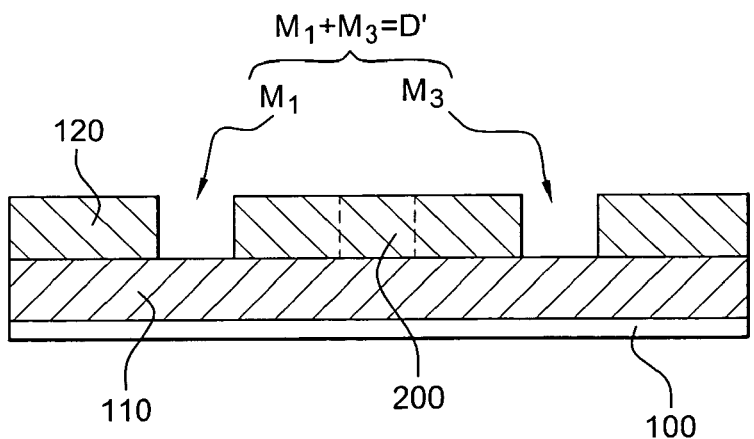
FIGS. 2, 4, 6 and 8 illustrate a layer of material in which an excess or missing pattern is made.

FIG. 2 illustrates the technological layer 110 resting on the substrate 100 and further covered by an added sacrificial layer 120 in which the aim was to form said patterns $M_1, M_2, M_3$, by a method of photolithography utilising a mask.

The sacrificial layer can be organic or mineral in nature, it can be conductive or semiconductive or insulating and can have a thickness for example between 1 nanometer and 10 micrometers. The sacrificial layer 120 illustrated in FIG. 2 is for example a layer based on TiN 50 nanometers thick.

Following said photolithography method, the sacrificial layer 120 illustrated in FIG. 2 is etched according to an erroneous design designated as D′, different from the design D to be made and which is lacking the pattern $M_2$. The erroneous design D' can originate from a mask, utilised during the photolithography method and which itself included defects.

Therefore, in the sacrificial layer 120 the pattern $M_2$ is missing a location 200 (delimited by dashed lines in FIG. 2).

A first method example according to the invention is illustrated in FIGS. 3A to 3F. It helps to correct the erroneous design D' which is missing a pattern.

Figure 3A:
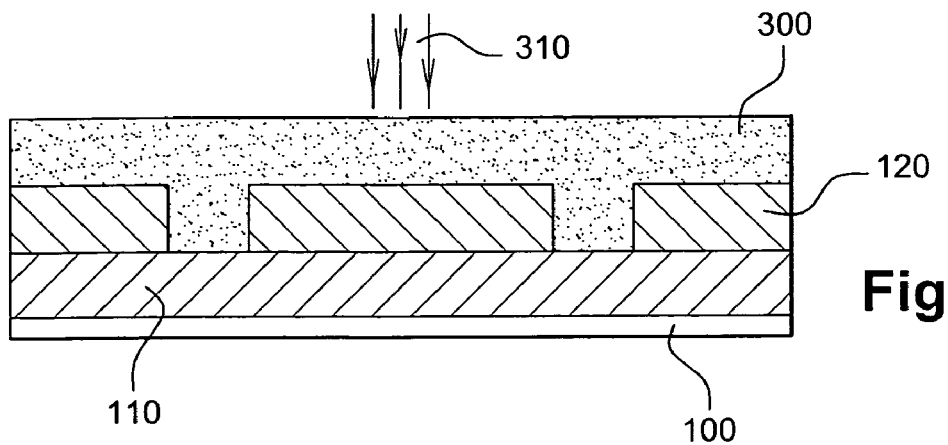
FIGS. 3A to 3F, illustrate an example of a method according to the invention allowing correction by adding patterns.

During the first step of this method illustrated in FIG. 3A, a layer 300, for example based on resin or polymer, is deposited on the sacrificial layer 120 or on the whole of the sacrificial layer 120. This layer 300 can be sensitive to radiation, for example electronic, ionic or photonic. The layer 300 can for instance be a resin layer, for example with positive tonality such as a TiS193UL® resin marketed by the company Archechemical, or a NOVOLAC® resin, or a PHS® resin. According to a variant, the layer 300 can likewise be formed by a stack of several sub-layers, for example a first sub-layer based on non-photosensitive resin topped by a second sub-layer sensitive to radiation such as electronic, ionic or photonic.

Next, a lithography step of this layer 300 is carried out as a function of the erroneous design D'. This lithography step forms a corrective element $C_1$ in the layer 300. The corrective element $C_1$ will be made in the layer 300, after being revealed, and in this case will take a form identical to the pattern $M_2$ missing in the sacrificial layer 120.

According to one possibility for carrying out the method, the lithography of the layer 300 can be carried out by lithography by direct writing, without the need to use an intermediate mask. Therefore, the method can add the missing pattern in the sacrificial layer without necessarily having to employ a new mask.

Figure 10:
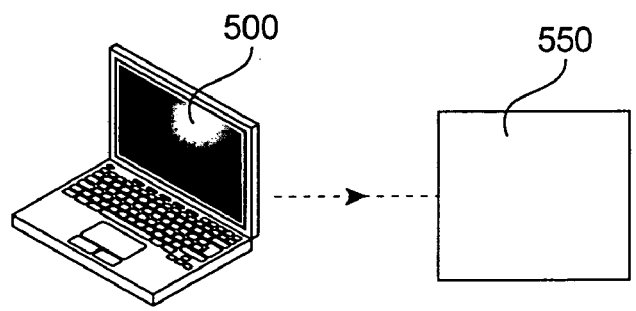
FIG. 10 illustrates an example of a device according to the invention.

The corrective element $C_1$ can be formed and placed on the resin layer 300, as a function both of the erroneous design D' in the sacrificial layer 120 and of the original design D. In fact, lithography can be undertaken for example by a lithography or photolithography device (FIG. 10), in which lithography or photolithography equipment 550 utilises an information file specifying information on the shape and location of the corrective element to be made. The file can be issued, for example, from a database or a data medium originating from an information-processing device 500, such as a computer or workstation, and can result from processing carried out by this computer or this workstation, in which a comparison is made between the original design D and the erroneous design D'.

Lithography can be done by at least one beam 310, particles optics, by means of which certain parts of the resin layer 300 are exposed to make the corrective element $C_1$.

The beam 310 can be for example a laser beam, or an X-ray beam, or an electron beam, or an ion beam, or a proton beam.

Figure 3B:
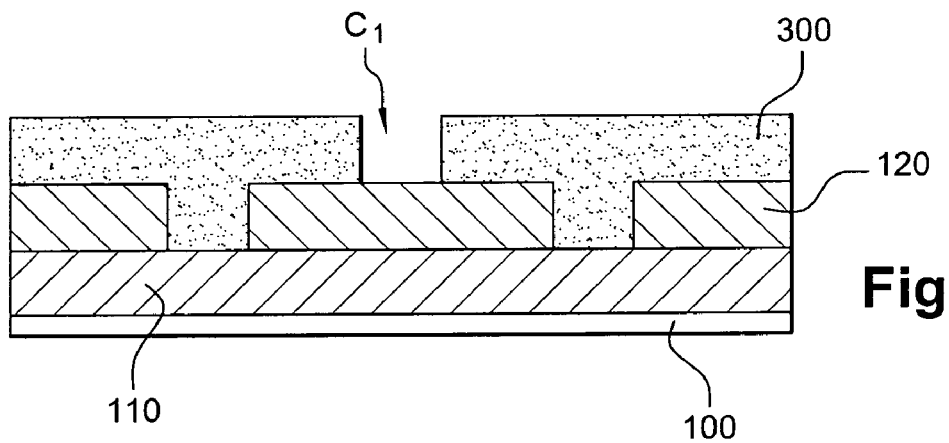
Figure 3C:
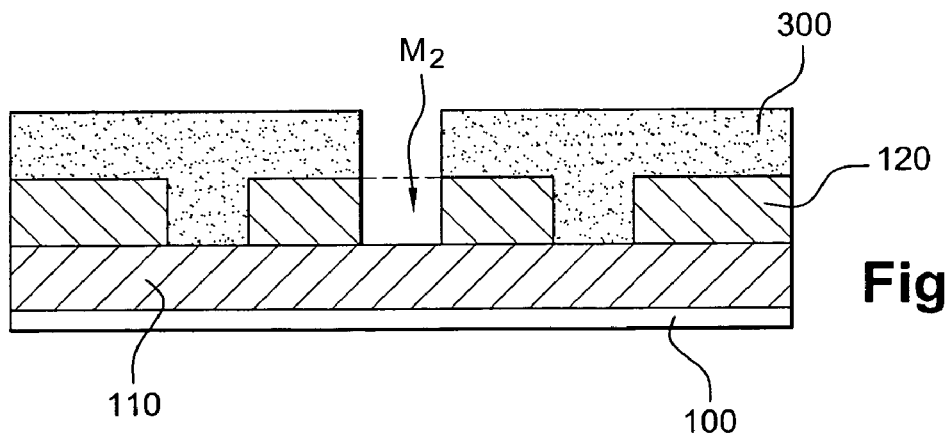

After exposure of the resin layer 300 to the beam 310, the latter is developed. The parts of the resin layer 300 exposed to the beam 310 are revealed and disappear to form the corrective element $C_1$ which has a form identical to the pattern $M_2$ missing in the sacrificial sub-layer 120 (FIG. 3B). Direct engraving defines zones topped by parts of the layer 300 and other zones not comprising parts of the layer 300.

Then (FIG. 3C), transfer of the corrective element $C_1$ to the sacrificial layer 120 is made. The transfer can be carried out by chemical etching or particle bombardment, for example plasma etching or humid chemical etching of the sacrificial layer 120 through the resin layer 300. The sacrificial layer 120 comprises the pattern $C_1$. This pattern corresponds to the pattern $M_2$ to be added to the sacrificial layer.

Figure 3D:
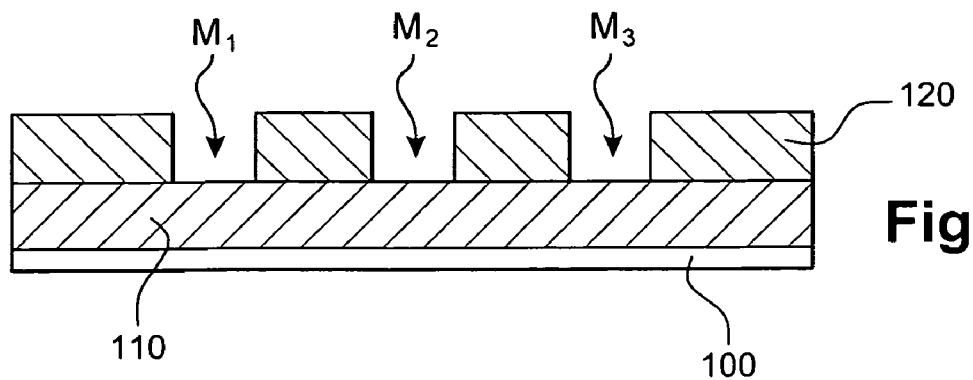

Next, the resin layer 300 is removed. The sacrificial layer then comprises the patterns $M_1$, $M_2$, $M_3$, and consequently the design D (FIG. 3D).

Figure 3E:
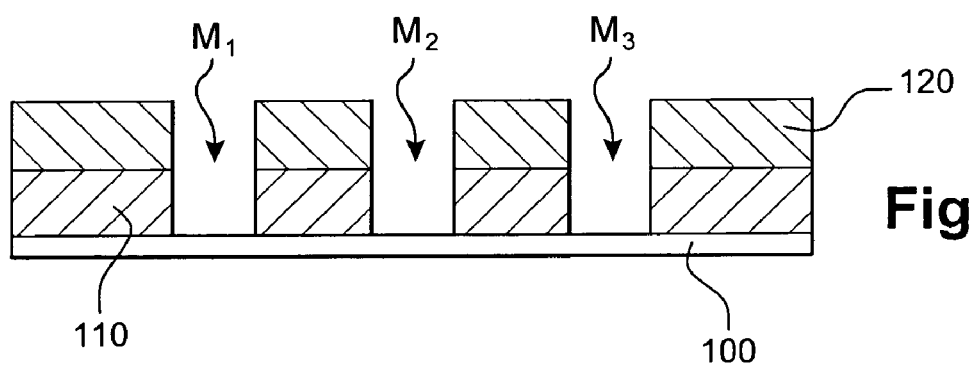
Figure 3F:
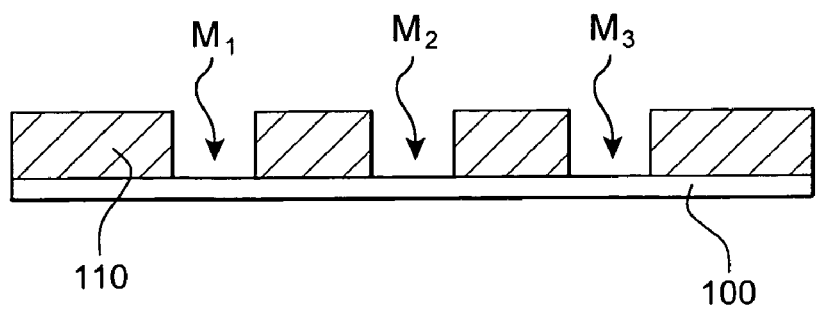

Then, by way of etching, for example chemical or plasma etching of the technological layer 110 through the sacrificial layer 120, the patterns $M_1$, $M_2$, $M_3$, are transferred to the technological layer 110 (FIG. 3E).

The sacrificial layer 120 (FIG. 3F) is finally removed. The removing of the sacrificial layer 120 can be conducted by dry etching, for example by means of plasma based on a gas reactive to this layer 120. It can also be carried out by humid etching, for example by means of a solution based on $H_2O_2$ and $H_2SO_4$ in the event where the sacrificial layer 120 is organic in nature. The removing can likewise optionally be completed by a combination of humid chemical etching followed by plasma etching. The method according to the invention is not limited to correction or addition of a single pattern: it allows as many patterns as necessary to be added to a thin layer etched according to an erroneous design, for example following a photolithography method.

The above method is applied in the event where a sacrificial layer is utilised above the technological layer.

But to make patterns such as the patterns $M_1$, $M_2$, $M_3$, illustrated in FIGS. 1A and 1B in a thin layer such as the technological layer 110, a method consists of forming these patterns $M_1$, $M_2$, $M_3$, by photolithography, directly in this technological layer 110 and without utilising an intermediate sacrificial layer.

Figure 4:
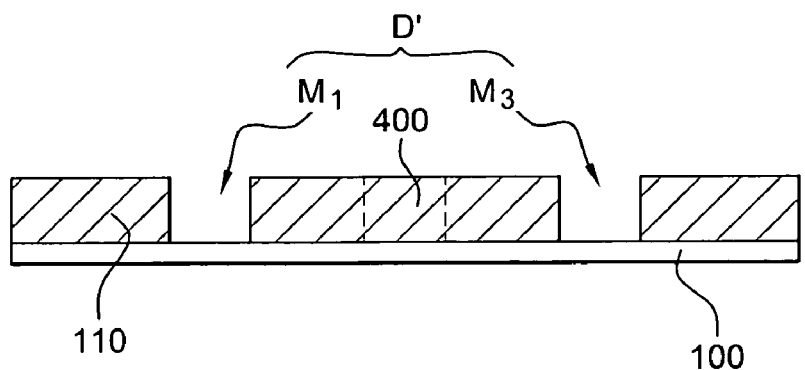

FIG. 4 illustrates this technological layer 110, added for example by photolithography, requiring the use of a mask, and by means of which said patterns $M_1$, $M_2$, $M_3$ were to be formed.

An error, for example, in design or fabricate of the mask utilised during the photolithography method caused the formation of an erroneous design D' directly in the technological layer 110, different from the design D to be made.

Therefore, the pattern $M_2$ is missing in the technological layer 110, the location of this missing pattern $M_2$ being indicated by hatching and by reference numeral 400 in FIG. 4.

Figure 5A:
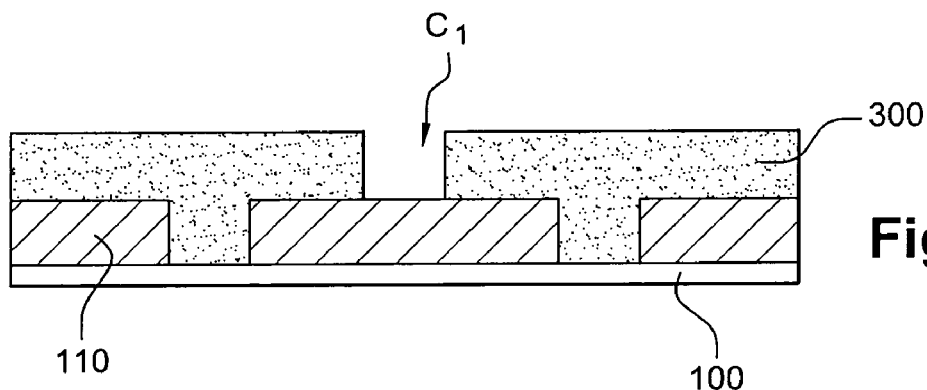
FIGS. 5A to 5B, illustrate another example of a method according to the invention allowing correction by adding patterns.
Figure 5B:
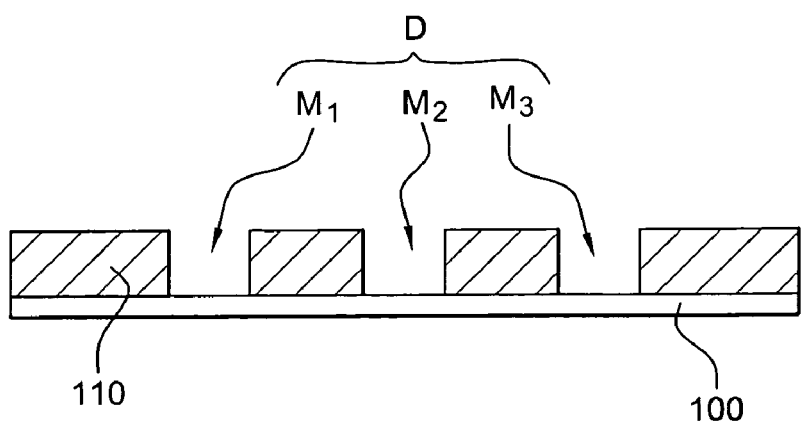

A second method example, according to the invention, is illustrated in FIGS. 5A-5B, and corrects the erroneous design D', made in the technological layer and missing a pattern.

This method example according to the invention thus allows the missing pattern to be added to the technological layer without employing a new mask.

During a first step of this method, a resin layer 300, for example a positive photosensitive resin layer, is deposited on the technological layer 110.

Next, lithography of the resin layer 300 is carried out. This lithography can be for example of the type known as <<by direct writing>>, that is, without utilising an intermediate mask. The lithography is completed as a function of the erroneous design D' in the technological layer 110 and of the desired design D in this same layer. It makes at least one corrective element $C_1$ in the resin layer 300. In this example, the corrective element is identical to the pattern $M_2$ missing on the design D'.

Lithography can be conducted by a beam or at least a particle or optic beam, by means of which certain parts of the resin layer 300 are exposed to form the corrective element $C_1$. The beam can be for example a laser beam, or an X-ray beam, or an electron beam or an ion beam or even a proton beam.

After exposure of the resin layer 300, the latter is developed. The parts of the resin layer 300 exposed to the beam disappear to produce, in the technological layer 110, the corrective element or pattern $C_1$ having a form identical to the pattern $M_2$ (FIG. 5A).

Next, the corrective element $C_1$ is transferred to the technological layer 110 by carrying out etching, for example plasma etching or chemical etching of the latter through the resin layer 300. The technological layer 110 thus comprises a hollow pattern, corresponding to the missing pattern $M_2$ to be added.

The resin layer 300 is then removed. The technological layer 110 comprises the pattern $M_1$, $M_2$, and $M_3$ forming the complete design D (FIG. 5B).

The method according to the invention is not limited to the correction of a single pattern in a thin layer as in the example previously described. It does in fact allow as many patterns as necessary to be added to a thin etched layer lacking certain patterns.

Figure 6:
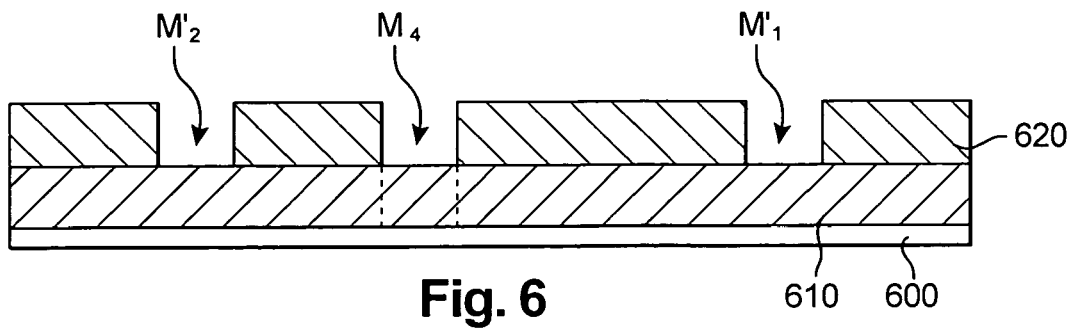

FIG. 6 illustrates a substrate 600, for example made of silicon and covered by a thin layer 610 known as a technological layer, in which a pattern $M_4$ is to be made, for example in the form of a hollow, such as a trench illustrated by contours shown in dotted lines. The technological layer 610 can be organic or mineral in nature, and it can be conductive or semiconductive or insulating. It is for instance a metallic layer based on TiN or again a dielectric layer of low dielectric constant, or again a layer of polysilicon acting as transistor gates.

For making the pattern $M_4$ in the technological layer 610 a first method can consist of initially forming this pattern $M_4$ by photolithography of a layer 620, known as a sacrificial layer, deposited on the technological layer 610.

Following an error, for example in design or fabricate of a mask utilised during said photolithography method, the sacrificial layer 620 illustrated in FIG. 6 comprises the pattern $M_4$, but also several excess erroneous pattern $M'_1$, $M'_2$, in the form of holes or/and trenches.

Figure 7A:
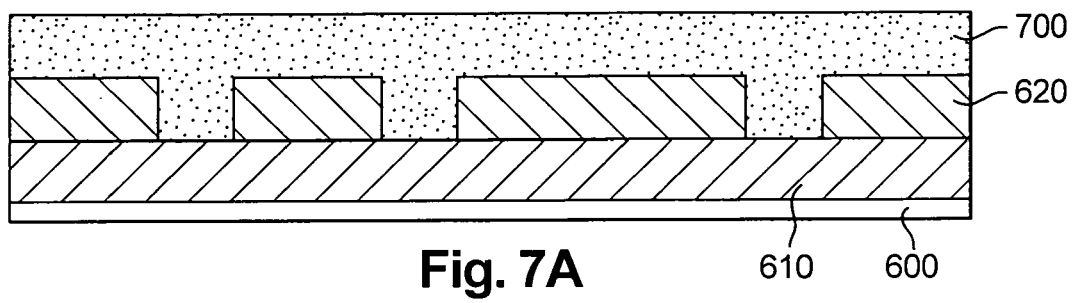
FIGS. 7A to 7C, illustrate an example of a method according to the invention allowing correction by removing patterns.
Figure 7B:
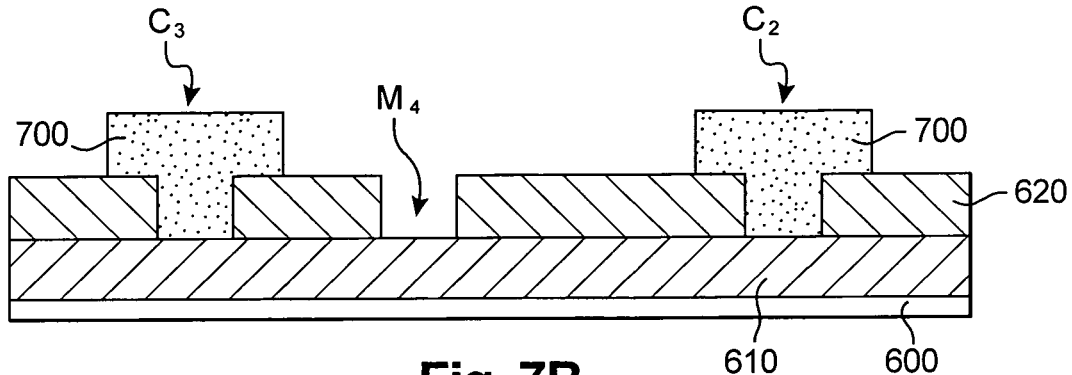
Figure 7C:
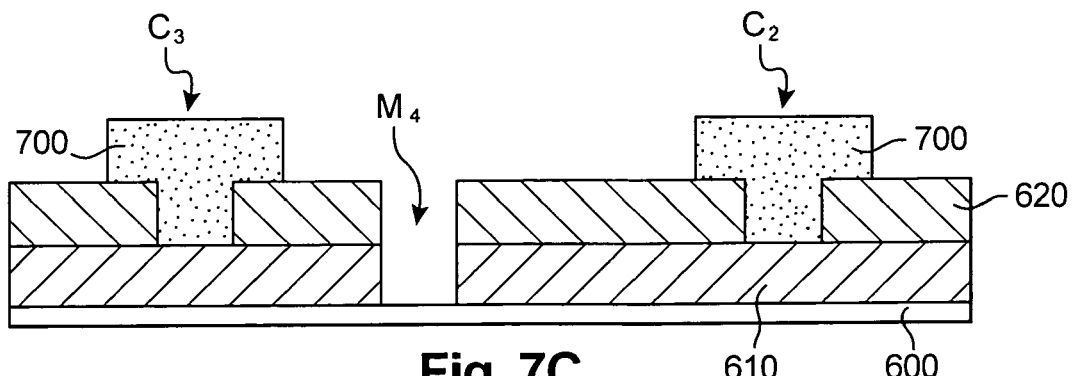

The method example according to the invention illustrated in FIGS. 7A-7C helps to correct these patterns $M'_1$ and $M'_2$ made in excess and form just the correct pattern in the technological layer.

During a first step, a resin layer 700 is deposited on the entire sacrificial layer 620 (FIG. 7A).

Next, a lithography step of the resin layer 700 is completed. According to an embodiment of the method, this lithography can be done by direct writing, that is, without using an intermediate mask.

Lithography is done as a function of the erroneous design D' formed in the sacrificial layer 620. The lithography step makes corrective elements $C_2$ and $C_3$ in the resin layer 700. In this case these corrective elements $C_2$ and $C_3$ take the form of blocks of resin respectively filling the erroneous patterns $M'_1$ and $M'_2$ in the form of a hole or trench in the sacrificial layer 620.

Lithography can be carried out by one beam or several beams, optionally several simultaneous particle or optical beams, by means of which certain parts of the resin layer 700 are exposed to make the corrective elements $C_2$ and $C_3$.

The beams can be for example based on X-rays or electron rays, or UV rays.

After exposure of the resin layer 700, by the beam(s) the latter is developed. The parts of the resin layer 300 exposed to the beam 310 disappear. What remains are the corrective elements $C_2$ and $C_3$, which take the form of blocks of resin, and which respectively fill out the excess pattern $M'_1$ and $M'_2$ in the sacrificial sub-layer 620 (FIG. 7B).

As is FIG. 7C, transfer only of the exact pattern $M_4$, is completed, for example by etching, or for example plasma etching or chemical etching of the technological layer 620 through the sacrificial layer 610.

Since the erroneous patterns $M'_1$ and $M'_2$ of the sacrificial layer 610 are filled by the blocks of resin 700, only the pattern $M_4$ is transferred to the technological layer 610. The sacrificial layer is then removed.

The method according to the invention is not limited to the correction of two patterns as in the example previously described: it actually eliminates as many excess patterns as necessary.

Figure 8:
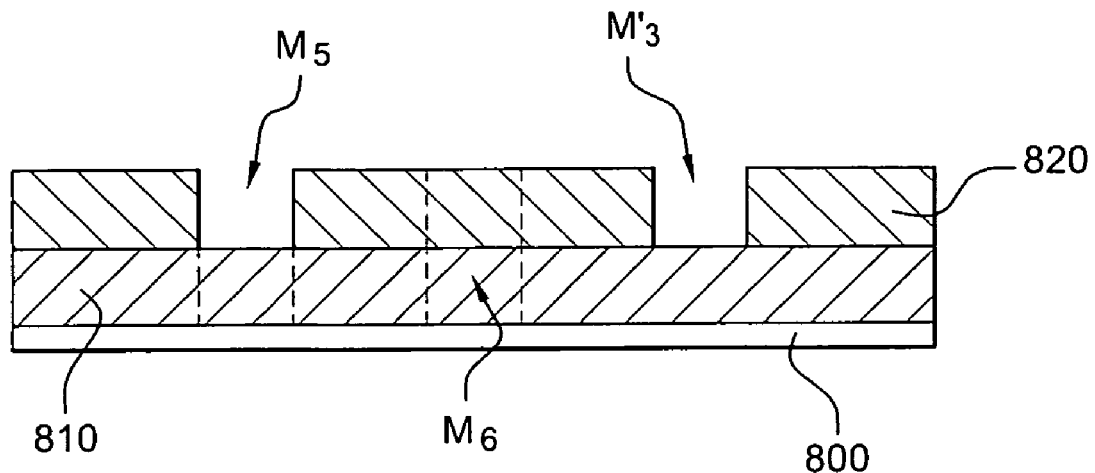

FIG. 8 illustrates a substrate 800, for example made of silicon, covered by a thin layer designated 810, known as the technological layer and, in which patterns $M_5$ and $M_6$ which will for example take the form of holes or trenches and are illustrated in FIG. 8 by contours in dashed lines are to be made.

The technological layer can be conductive or semiconductive or insulating and have a thickness for example between 1 nanometer and 10 micrometers. The technological layer 810 is for example a dielectric layer of low dielectric constant (<<low-k>> according to English terminology).

For making the pattern $M_5$ and $M_6$ in this technological layer 810, a method consists of first forming these patterns $M_5$ and $M_6$ by a photolithography method of another thin layer designated 820, known as a sacrificial layer, and which is deposited on the technological layer 810. The sacrificial layer 820 is for example a layer based on nitride or silicon oxide.

Following an error, for example in design or fabricate of a mask utilised during said photolithography method, the sacrificial layer 820 illustrated in FIG. 8 is etched according to an erroneous design comprising the pattern $M_5$ exact, but which the pattern $M_6$ is lacking. This erroneous design further comprises an erroneous excess pattern $M'_3$ in the sacrificial layer 820 and which for example takes the shape of a hole or a trench.

Figure 9A:
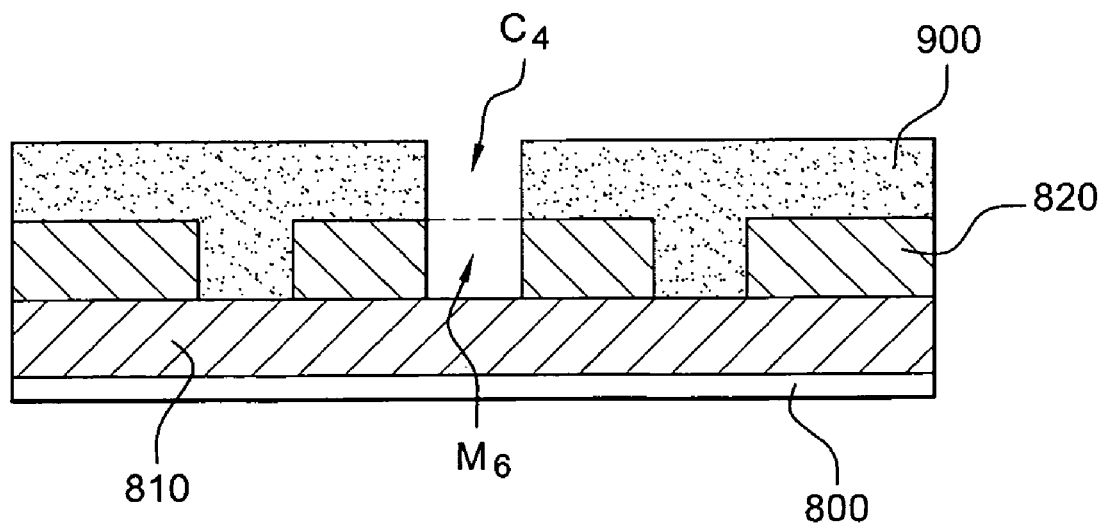
FIGS. 9A to 9D, illustrate an example of a method according to the invention allowing correction by adding then removing patterns.
Figure 9B:
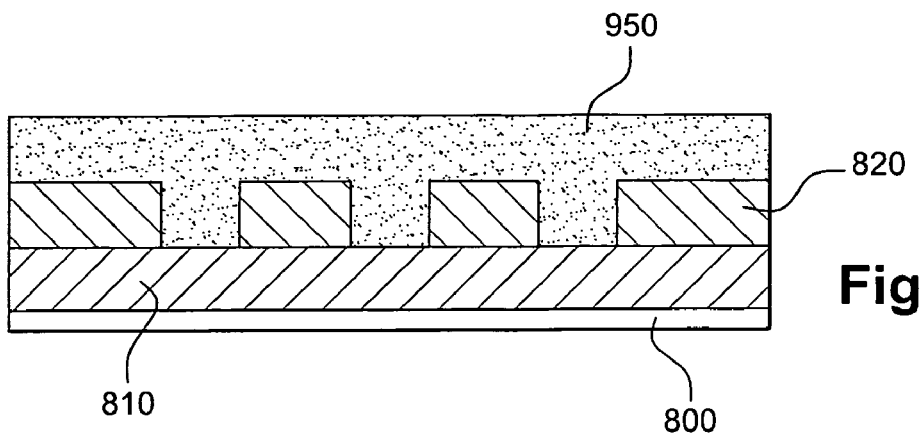
Figure 9C:
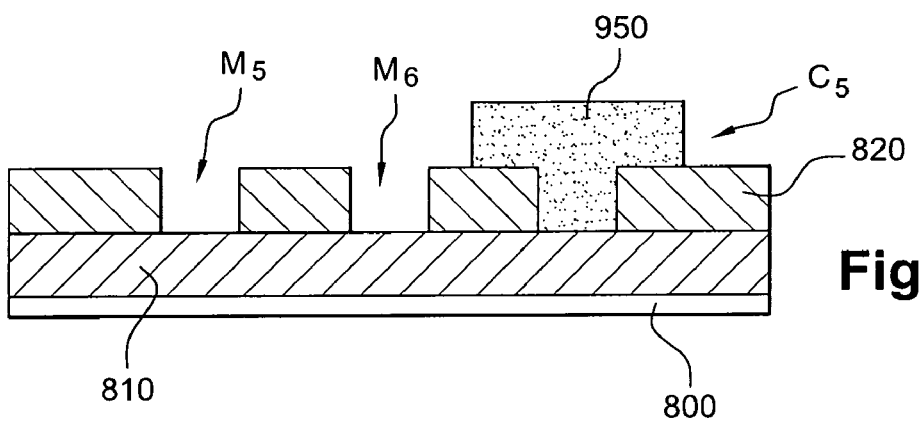
Figure 9D:
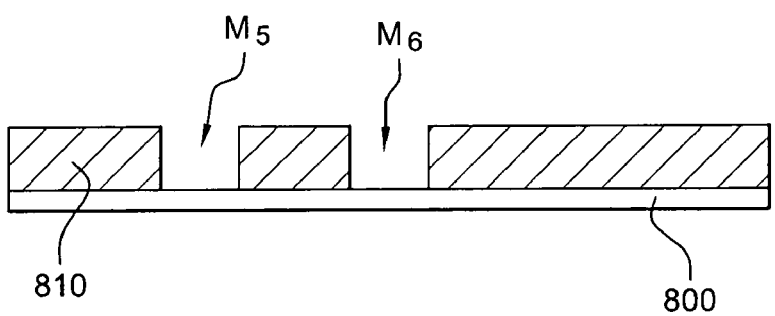

A method example according to the invention allowing such a design to be corrected, made in a thin etched layer such as the sacrificial layer 820, in which certain patterns are in excess and which is missing certain patterns, will now be described. It is illustrated by FIGS. 9A to 9C.

During a first step of this method, a first resin layer 900 is deposited on the sacrificial layer 820. The resin layer 900 can be for example a positive photosensitive resin.

Next, a first lithography or photolithography step is completed. According to one possibility, this lithography can be by direct writing of the resin layer 900, that is, without utilising an intermediate mask. This first lithography step provides a first corrective element designated $C_4$ in the resin layer 900 in the form of an opening identical to the missing pattern $M_6$.

Lithography can be completed by a particle beam or a light beam, by means of which certain parts of the resin layer 900 are exposed to form the corrective element $C_4$. Said beam can be for example an X-ray beam, a laser beam, an electron beam, an ion beam, a proton beam, or a UV beam. After exposure by the beam of the resin layer 900, the latter is developed. The parts of the resin layer 900, exposed to the beam, disappear to form the corrective element $C_4$.

Next, etching of the sacrificial layer 820 is done through the resin layer 900. This etching enables the corrective element $C_4$ to be transferred to the sacrificial layer. The sacrificial layer 820 then comprises the missing pattern $M_6$ in the form of a trench or a hole (FIG. 9A).

Next, the first resin layer 900 is removed, then a second resin layer 950, for example a negative photosensitive resin layer is deposited.

Next, a second lithography step by direct writing of the second resin layer 950 is carried out, without using an intermediate mask (FIG. 9C). This second lithography step by direct writing prepares the formation of a second corrective element in the resin layer 950 in the form of a block of resin $C_5$ filling out the erroneous pattern $M'_3$ which has the shape of a hole or an excess trench in the sacrificial layer 820. The lithography for forming the corrective element $C_5$ can be done by way of a particle or optic beam, originating from the same lithography equipment as that utilised during the first lithography step to form the corrective element $C_4$. Certain parts of the resin layer 950 are exposed by means of this beam.

After exposure of the resin layer 950 by the beam, the latter is developed. The parts exposed to the beam 310 of the resin layer 950 disappear. The corrective element $C_4$ in the form of a block of resin filling up the pattern $M'_2$ is thus made.

Then, etching of the technological layer 820 is done through the resin layer 950, during which only the patterns $M_5$ and $M_6$ are transferred.

Irrespective of the embodiment described hereinabove, the steps of photolithography can be carried out by means of a lithography device implemented according to the invention, by controlling a machine or lithography equipment 550 by means of data known as <<correction>> or at least one <<correction>> information file allowing the desired correction. These correction data or this correction file can be generated by an information-processing device 500, such as for example a computer or a workstation.

An example of logical operations, executed by a processor, for example, a microprocessor, or a central processing unit of the device 500 allowing such data or such a file to be created will now be explained hereinbelow.

It is a question in fact of compiling a standard information file reproducing the corrections to be made.

To obtain the files allowing the addition and subtraction corrections, the information-processing device 500 can comprise a calculating section with electronic or software components or others allowing all types of Boolean operations to be carried into effect, and likewise enabling shaping of data in a format directly utilisable by the lithography equipment 550 to be carried out, producing the engraving beam.

There are two starting files, A and B, file A corresponding to the erroneous design and file B to the desired corrected design. These files can be saved in a memory, for example on a hard drive, or a ROM read-only memory, or a compact disc, or a dynamic random access memory DRAM or any other type of RAM memory, or a magnetic or optical storage element, or registers or other volatile and/or non-volatile memories of the device 500.

As to what relates to the patterns to be added, an algorithm comprising a Boolean subtraction operation is executed between the two files A and B, the result of which is to retain, for example in a new file $C_1$, only those patterns added to file B and which were not in the erroneous file A.

The new file $C_1$, is transmitted by the information device 500 to the lithography equipment 550, in a usable form. The equipment 550 can then produce one or more engraving beams and thus directly and selectively adds one or more missing patterns to a thin layer resting on a plate.

As for the excess patterns to be removed, the Boolean subtraction operation can this time retain only the patterns present solely in file A and which are to be finally removed. After this processing, an adjustment operation can be carried out so as to enlarge the edges and ensure total covering of the pattern to be removed during the technological processing: potential problems of misalignment caused by the method are thus avoided. The size of the adjustment depends on the environment of the other patterns in the final design and the alignment performances of the lithographic method utilised.

A new file $C_2$, the result of this processing, is transmitted by the information device 500 to the lithography equipment 550, in usable form.

When the patterns are to be added and when other patterns are to be eliminated, two databases or data files can be prepared, making discrete the two logical operations to provide overall repairs.

The information device 550 will be capable of saving the correction data compiled as indicated hereinabove, and controlling the engraving means or machine 500 for making these corrections.

DOCUMENTS

[1]: B. Ward et al., Proc. SPIE, vol. 537, 110-6, 1985.
[2]: U.S. Pat. No. 4,751,169
[3]: EP 0 200 333.

The invention claimed is:

1. A correction method for correction of an erroneous design made in a first thin layer including at least one first engraved sub-layer including the erroneous design and at least one second sub-layer located between a substrate and the first sub-layer, the method comprising:
   a) depositing a second thin layer on the first thin layer;
   b) lithography of the second thin layer, as a function of a desired correction or corrections,
   etching the first sub-layer through the second thin layer;
   removing the second thin layer;
   depositing a third thin layer on the first sub-layer; and
   second lithography in the third thin layer leaving blocks filling the patterns in excess; and
   c) etching the second sub-layer through the first sub-layer.

2. A correction method as claimed in claim 1, the lithography being carried out by one or more optical particle beams.

3. A method as claimed in claim 2, the one or more optical particle beams being selected from among: an ion beam, an electron beam, a proton beam, an X-ray beam, a laser beam, an UV beam.

4. A method as claimed in claim 3, the beam being controlled by a digital device associated with a data medium including data relative to the erroneous design and to a desired corrected design.

5. A correction method for correction of an erroneous design made in a first thin layer including at least one first engraved sub-layer including the erroneous design and at least one second sub-layer located between a substrate and the first sub-layer, the method comprising:
   a) depositing a second thin layer on the first thin layer;
   b) lithography of the second thin layer, as a function of a desired correction or corrections, etching the first sub-layer through the second thin layer;
   removing the second thin layer after the etching of the first sub-layer through the second thin layer; and
   c) etching the second sub-layer through the first sub-layer.

6. A method as claimed in claim 5, the second thin layer being a resin or polymer layer.

7. A method as claimed in claim 5, the lithography being carried out by one or more optical particle beams.

8. A method as claimed in claim 7, the one or more optical particle beams being selected from among: an ion beam, an electron beam, a proton beam, an X-ray beam, a laser beam, an UV beam.

9. A method as claimed in claim 8, the beam being controlled by a digital device associated with a data medium including data relative to the erroneous design and to a desired corrected design.

10. A correction method for correction of an erroneous design made in a first thin layer including at least one first engraved sub-layer including the erroneous design and at least one second sub-layer located between a substrate and the first sub-layer, the method comprising:

a) depositing a second thin layer covering said first thin layer;

b) lithography of the second thin layer, as a function of desired corrections; and c) etching the second sub-layer through the first sub-layer;

the method further comprising after step c):

removing said first sub-layer.

11. A method as claimed in claim 10, the lithography being carried out by direct writing.

12. A method as claimed in claim 10, the lithography being carried out by one or more optical particle beams.

13. A method as claimed in claim 12, the one or more optical particle beams being selected from among: an ion beam, an electron beam, a proton beam, an X-ray beam, a laser beam, an UV beam.

14. A method as claimed in claim 13, the beam being controlled by a digital device associated with a data medium including data relative to the erroneous design and to a desired corrected design.

* * * * *